US012615765B2

(12) United States Patent
Liu

(10) Patent No.: US 12,615,765 B2
(45) Date of Patent: Apr. 28, 2026

(54) MEMORY COMPRISING A GATE CONDUCTIVE LAYER HAVING A BENT PORTION AND MANUFACTURING METHOD THEREOF

(71) Applicant: CHANGXIN MEMORY TECHNOLOGIES, INC., Hefei City (CN)

(72) Inventor: Chihcheng Liu, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 436 days.

(21) Appl. No.: 17/598,829

(22) PCT Filed: Jun. 30, 2021

(86) PCT No.: PCT/CN2021/103829
§ 371 (c)(1),
(2) Date: Sep. 27, 2021

(87) PCT Pub. No.: WO2022/037275
PCT Pub. Date: Feb. 24, 2022

(65) Prior Publication Data
US 2023/0276618 A1     Aug. 31, 2023

(30) Foreign Application Priority Data
Aug. 18, 2020    (CN) .......................... 202010832602.9

(51) Int. Cl.
*H10B 12/00* (2023.01)

(52) U.S. Cl.
CPC ........... *H10B 12/488* (2023.02); *H10B 12/02* (2023.02)

(58) Field of Classification Search
CPC ............. H01L 29/0649; H01L 29/4238; H01L 29/4236; H01L 29/42364; H01L 29/42368;
(Continued)

(56) References Cited

U.S. PATENT DOCUMENTS 4,651,183 A * 3/1987 Lange ................... G11C 11/408
257/911
4,935,791 A * 6/1990 Namaki ................. H10B 69/00
257/E27.103
(Continued)

FOREIGN PATENT DOCUMENTS

CN          1153294 C      6/2004
CN       107731907 A      2/2018
(Continued)

OTHER PUBLICATIONS

First Office Action cited in CN202010832602.9, mailed Jul. 29, 2022, 12 pages.
(Continued)

*Primary Examiner* — Sophia T Nguyen
(74) *Attorney, Agent, or Firm* — Syncoda LLC; Feng Ma

(57) ABSTRACT

The present disclosure discloses a memory and a manufacturing method thereof. The memory includes: active regions extending in a first direction and word lines extending in a second direction, wherein each of the word lines is partially located between adjacent active regions; the word line includes a gate conductive layer; and, in a direction parallel to the first direction, each of the active regions has an end face facing the word lines, and an extreme difference in distances between the end face and the gate conductive layer is within a preset range.

19 Claims, 8 Drawing Sheets

(58) Field of Classification Search

CPC ........ H01L 29/42376; H01L 29/42372; H10B 12/488; H10B 12/053; H10B 12/34; H10B 12/00

See application file for complete search history.

(56) References Cited

U.S. PATENT DOCUMENTS

| | | | | | |
|---|---|---|---|---|---|
| 5,065,215 | A * | 11/1991 | Kubota | H10B 12/377 | 257/301 |
| 5,396,451 | A * | 3/1995 | Ema | H01L 23/528 | 365/72 |
| 5,457,064 | A * | 10/1995 | Lee | H10B 12/31 | 438/129 |
| 5,459,341 | A * | 10/1995 | Shono | H10B 12/31 | 257/311 |
| 5,566,104 | A * | 10/1996 | Shinkawata | G11C 11/4097 | 365/51 |
| 5,812,443 | A * | 9/1998 | Lee | H10B 12/31 | 257/296 |
| 5,867,434 | A * | 2/1999 | Oh | H10B 12/50 | 257/E27.097 |
| 6,097,621 | A * | 8/2000 | Mori | G11C 11/22 | 257/296 |
| 6,211,544 | B1 | 4/2001 | Park et al. | | |
| 6,271,081 | B2 * | 8/2001 | Kajiyama | H10B 12/0385 | 438/386 |
| 6,396,096 | B1 * | 5/2002 | Park | H10B 12/0335 | 257/908 |
| 7,157,328 | B2 * | 1/2007 | Tews | H10D 1/047 | 438/386 |
| 7,785,483 | B2 * | 8/2010 | Jung | H01L 21/3083 | 430/5 |
| 7,994,559 | B2 * | 8/2011 | Wang | H01L 29/66621 | 257/302 |
| 8,283,229 | B2 * | 10/2012 | Kim | H10B 12/482 | 257/327 |
| 8,691,649 | B2 * | 4/2014 | Park | H10B 10/00 | 438/270 |
| 8,835,252 | B2 * | 9/2014 | Moon | H10B 12/34 | 438/396 |
| 8,975,140 | B2 * | 3/2015 | Chung | H01L 29/66621 | 438/270 |
| 9,018,695 | B2 * | 4/2015 | Yang | H01L 29/42368 | 257/329 |
| 9,030,732 | B2 * | 5/2015 | Strohkendl | H01S 3/0632 | 359/342 |
| 9,105,508 | B2 * | 8/2015 | Kang | H10B 12/488 | |
| 9,171,847 | B1 * | 10/2015 | Lee | H01L 29/66621 | |
| 9,306,058 | B2 * | 4/2016 | Vielemeyer | H10D 30/65 | |
| 9,431,324 | B2 * | 8/2016 | Shin | H10B 12/488 | |
| 9,508,723 | B2 * | 11/2016 | Lee | H10B 12/34 | |
| 9,536,884 | B2 * | 1/2017 | Kim | H10B 12/488 | |
| 9,634,134 | B2 * | 4/2017 | Ting | H10B 12/053 | |
| 9,716,095 | B2 * | 7/2017 | Kim | H10B 12/09 | |
| 9,768,115 | B2 * | 9/2017 | Choi | H10B 12/482 | |
| 9,853,031 | B1 * | 12/2017 | Cho | H10B 12/34 | |
| 9,972,626 | B1 * | 5/2018 | Takesako | H10B 12/34 | |
| 10,083,906 | B1 * | 9/2018 | Jen | H01L 23/5226 | |
| 10,199,379 | B2 * | 2/2019 | Cho | H01L 28/90 | |
| 10,211,086 | B2 * | 2/2019 | Nagai | H10B 12/315 | |
| 10,319,726 | B2 * | 6/2019 | Nam | H10B 12/36 | |
| 10,366,993 | B2 * | 7/2019 | Chang | H01L 29/0649 | |
| 10,607,996 | B1 | 3/2020 | Sasaki | | |
| 10,615,164 | B2 * | 4/2020 | Kim | H10B 12/315 | |
| 10,833,088 | B2 * | 11/2020 | Im | H01L 29/4958 | |
| 10,964,704 | B2 * | 3/2021 | Lee | H01L 21/28105 | |
| 11,004,854 | B2 * | 5/2021 | Nam | H10B 12/34 | |
| 11,088,144 | B2 * | 8/2021 | Seo | H10B 12/34 | |
| 11,387,239 | B2 * | 7/2022 | Liu | H10B 12/315 | |
| 11,417,666 | B2 * | 8/2022 | Lin | H01L 21/76224 | |
| 11,462,544 | B2 * | 10/2022 | Tang | H01L 23/528 | |
| 11,508,733 | B2 * | 11/2022 | Noh | H01L 21/31155 | |
| 11,825,644 | B2 * | 11/2023 | Zhang | H10B 12/31 | |
| 11,963,344 | B2 * | 4/2024 | Choi | H01L 21/30604 | |
| 12,362,192 | B2 * | 7/2025 | Yu | H10P 50/693 | |
| 2001/0000689 | A1 * | 5/2001 | Kajiyama | H10B 12/0385 | 257/E27.093 |
| 2003/0168680 | A1 * | 9/2003 | Hsu | H10D 30/711 | 257/E21.655 |
| 2003/0185073 | A1 * | 10/2003 | Kim | H10B 41/27 | 257/E27.103 |
| 2003/0205751 | A1 * | 11/2003 | Kimura | H01L 29/456 | 257/306 |
| 2004/0099891 | A1 * | 5/2004 | Mehrotra | H10D 62/235 | 257/E29.136 |
| 2006/0060916 | A1 * | 3/2006 | Girdhar | H01L 29/7813 | 257/E29.066 |
| 2006/0097301 | A1 * | 5/2006 | Wang | H10B 12/00 | 257/296 |
| 2006/0105249 | A1 * | 5/2006 | Kushida | G03F 1/36 | 430/30 |
| 2006/0114707 | A1 * | 6/2006 | Inaba | G11C 5/063 | 365/51 |
| 2006/0237781 | A1 * | 10/2006 | Marchant | H01L 29/42368 | 257/E29.066 |
| 2007/0087499 | A1 * | 4/2007 | Seo | H01L 29/66666 | 257/E21.655 |
| 2007/0161179 | A1 * | 7/2007 | Lee | H10B 12/37 | 438/243 |
| 2007/0248893 | A1 * | 10/2007 | Kang | G03F 1/68 | 430/30 |
| 2007/0284662 | A1 * | 12/2007 | Chinthakindi | H10D 84/811 | 257/350 |
| 2008/0048230 | A1 * | 2/2008 | Yamazaki | H10D 64/513 | 257/E21.336 |
| 2008/0064167 | A1 * | 3/2008 | Kim | H01L 21/3083 | 257/E21.429 |
| 2008/0153277 | A1 * | 6/2008 | Jung | H01L 21/28123 | 257/E21.294 |
| 2008/0283816 | A1 * | 11/2008 | Takaishi | H10B 63/00 | 257/E47.001 |
| 2009/0114968 | A1 * | 5/2009 | Wang | H10P 30/204 | 257/E29.255 |
| 2009/0166723 | A1 * | 7/2009 | Sung | H10B 12/053 | 438/587 |
| 2009/0236656 | A1 * | 9/2009 | Sung | H10B 12/488 | 257/329 |
| 2010/0258858 | A1 * | 10/2010 | Kim | H01L 29/7851 | 438/270 |
| 2011/0014553 | A1 * | 1/2011 | Kim | H01L 21/823481 | 430/5 |
| 2011/0024870 | A1 * | 2/2011 | Lee | H10B 12/48 | 257/E21.085 |
| 2011/0111568 | A1 * | 5/2011 | Kim | H10B 12/482 | 257/E21.421 |
| 2012/0231605 | A1 * | 9/2012 | Kim | H01L 21/76224 | 257/E21.546 |
| 2013/0011989 | A1 * | 1/2013 | Park | H10B 12/485 | 257/E21.646 |
| 2013/0049110 | A1 * | 2/2013 | Wang | H10B 12/34 | 257/334 |
| 2014/0061743 | A1 * | 3/2014 | Kim | H10D 84/83 | 257/296 |
| 2014/0110786 | A1 * | 4/2014 | Kim | H01L 29/785 | 257/365 |
| 2014/0117492 | A1 * | 5/2014 | Kim | H10D 62/115 | 257/508 |
| 2014/0291755 | A1 * | 10/2014 | Baek | H01L 29/7827 | 257/334 |
| 2015/0021684 | A1 * | 1/2015 | Lee | H10B 12/34 | 438/270 |
| 2015/0194438 | A1 * | 7/2015 | Kim | H10B 12/488 | 257/324 |
| 2015/0255464 | A1 * | 9/2015 | Lee | H10B 12/482 | 438/237 |
| 2016/0087035 | A1 * | 3/2016 | Kim | H01L 27/088 | 257/368 |
| 2016/0099307 | A1 * | 4/2016 | Padmanabhan | H01L 29/78 | 257/329 |

(56) References Cited

U.S. PATENT DOCUMENTS

| | | | | |
|---|---|---|---|---|
| 2016/0181251 | A1* | 6/2016 | Yoo | H01L 28/90 |
| | | | | 257/296 |
| 2016/0204201 | A1* | 7/2016 | Oh | H10B 12/315 |
| | | | | 257/330 |
| 2016/0260813 | A1* | 9/2016 | Cho | H01L 29/4966 |
| 2016/0284640 | A1* | 9/2016 | Wang | H01L 27/0207 |
| 2016/0351711 | A1* | 12/2016 | Bae | H01L 27/11807 |
| 2016/0372586 | A1* | 12/2016 | Fujii | H01L 29/7397 |
| 2017/0018552 | A1* | 1/2017 | Moon | H01L 21/76232 |
| 2017/0040327 | A1* | 2/2017 | Nobuto | H10B 12/488 |
| 2017/0047421 | A1* | 2/2017 | Oh | H10B 63/30 |
| 2017/0263723 | A1* | 9/2017 | Lee | H01L 29/7827 |
| 2017/0365608 | A1* | 12/2017 | Lee | H10D 64/513 |
| 2018/0158826 | A1* | 6/2018 | Cho | H10B 12/34 |
| 2018/0212030 | A1* | 7/2018 | Wu | H10B 12/488 |
| 2018/0277191 | A1* | 9/2018 | Yoo | H01L 29/78391 |
| 2018/0286742 | A1* | 10/2018 | Nagai | H01L 21/76224 |
| 2018/0323303 | A1* | 11/2018 | Liu | H01L 29/4966 |
| 2018/0337187 | A1* | 11/2018 | Tsai | H10B 12/34 |
| 2019/0006368 | A1* | 1/2019 | Chang | H10B 12/34 |
| 2019/0027480 | A1* | 1/2019 | Lee | H10D 64/671 |
| 2019/0157274 | A1* | 5/2019 | Chang | H10B 12/053 |
| 2019/0296020 | A1* | 9/2019 | Chang | H01L 29/0649 |
| 2020/0176452 | A1* | 6/2020 | Ting | H10B 12/34 |
| 2020/0203352 | A1* | 6/2020 | Im | H10D 64/666 |
| 2020/0203353 | A1* | 6/2020 | Liu | H10B 12/485 |
| 2020/0381436 | A1* | 12/2020 | Noh | H01L 21/31155 |
| 2021/0005614 | A1* | 1/2021 | Lin | H10B 12/34 |
| 2021/0104529 | A1* | 4/2021 | Choi | H10B 12/488 |
| 2021/0257374 | A1* | 8/2021 | Lee | H10B 12/34 |
| 2021/0272961 | A1* | 9/2021 | Tung | H10B 12/485 |
| 2021/0375879 | A1* | 12/2021 | Hsu | H10B 12/053 |
| 2021/0408251 | A1* | 12/2021 | Huang | H10B 12/053 |
| 2022/0037327 | A1* | 2/2022 | Tung | H10B 12/0335 |
| 2022/0037329 | A1* | 2/2022 | Xu | H10B 12/053 |
| 2022/0037478 | A1* | 2/2022 | Lu | H01L 29/42376 |
| 2022/0045063 | A1* | 2/2022 | Ryu | H01L 28/60 |
| 2022/0052051 | A1* | 2/2022 | Liu | H01L 29/0649 |
| 2022/0271043 | A1* | 8/2022 | Choi | H10B 12/34 |
| 2022/0302119 | A1* | 9/2022 | Guo | H10B 12/30 |
| 2022/0310782 | A1* | 9/2022 | Zhang | H01L 21/823481 |
| 2022/0344343 | A1* | 10/2022 | Wei | H10B 12/34 |
| 2022/0359528 | A1* | 11/2022 | Zhang | H10B 12/315 |
| 2022/0359531 | A1* | 11/2022 | Zhang | H10B 12/315 |
| 2022/0367475 | A1* | 11/2022 | Wei | H10B 12/315 |
| 2023/0276618 | A1* | 8/2023 | Liu | H10B 12/02 |
| | | | | 257/295 |
| 2023/0301069 | A1* | 9/2023 | Li | H10B 12/053 |
| | | | | 257/296 |
| 2024/0032273 | A1* | 1/2024 | Chen | G11C 5/063 |
| 2025/0126872 | A1* | 4/2025 | Bae | H10D 64/513 |
| 2025/0151263 | A1* | 5/2025 | Huang | H10B 12/34 |
| 2025/0220887 | A1* | 7/2025 | Hwang | H10B 12/053 |

FOREIGN PATENT DOCUMENTS

| | | |
|---|---|---|
| CN | 207719209 U | 8/2018 |
| CN | 207852674 U | 9/2018 |
| CN | 108666313 A | 10/2018 |
| CN | 108899309 A | 11/2018 |
| CN | 110534480 A | 12/2019 |
| CN | 210272310 U | 4/2020 |
| KR | 20090103508 A | 10/2009 |

OTHER PUBLICATIONS

International Search Report cited in PCT/CN2021/103829 mailed Sep. 23, 2021, 8 pages.

* cited by examiner

MEMORY COMPRISING A GATE CONDUCTIVE LAYER HAVING A BENT PORTION AND MANUFACTURING METHOD THEREOF

CROSS-REFERENCE TO RELATED APPLICATIONS

The present disclosure claims the priority to Chinese Patent Application 202010832602.9, titled "MEMORY AND MANUFACTURING METHOD THEREOF", filed to the CNIPA on Aug. 18, 2020, which is incorporated herein by reference in its entirety.

TECHNICAL FIELD

The present disclosure relates to, but not limited to, a memory and a manufacturing method thereof.

BACKGROUND

As memory components for storing programs and various data information, memory can be classified into read only memory and random access memory depending upon the use type of memory. A memory usually includes a capacitor and a transistor connected to the capacitor. The capacitor is configured to store charges representing the stored information, and the transistor is a switch for controlling the introduction and release of charges in the capacitor. The source, drain and gate are formed in the transistor, wherein the gate is connected to the word line.

However, with the continuous reduction of process nodes, the signal interference caused by the row hammer effect in the memory becomes more and more serious. Therefore, how to solve this problem has become an important direction in the memory process optimization.

SUMMARY

The present disclosure provides a memory, comprising: a plurality of active regions extending along a first direction and an isolation structure between the active regions; a plurality of word lines extending along a second direction, the first direction is not perpendicular to the second direction; and the word line comprises a gate conductive layer; wherein the gate conductive layer comprises a straight portion located in the active region and a bent portion located in the isolation structure.

The present disclosure further provides a method for manufacturing a memory.

The method for manufacturing a memory according to the embodiments of the present disclosure comprises: providing an active region extending along a first direction and a recess extending along a second direction, and an isolation structure is arranged between the adjacent active regions, and the recess is located in the active region and the isolation structure; a word line is formed in the recess, and the word line comprises a gate dielectric layer and a gate conductive layer; wherein the gate conductive layer comprises a straight portion located in the active region and a bent portion located in the isolation structure.

BRIEF DESCRIPTION OF THE DRAWINGS

The drawings incorporated into the specification and constituting a part of the specification show the embodiments of the present disclosure, and are used with the description to explain the principles of the embodiments of the present disclosure. Throughout the drawings, similar reference numerals denote similar elements. The drawings to be described hereinafter are some but not all of the embodiments of the present disclosure. Those skilled in the art can obtain other drawings according to these drawings without paying any creative effort.

DETAILED DESCRIPTION

The memory and manufacturing method thereof according to the present disclosure will be described below by specific implementations with reference to the drawings.

Figure 1:
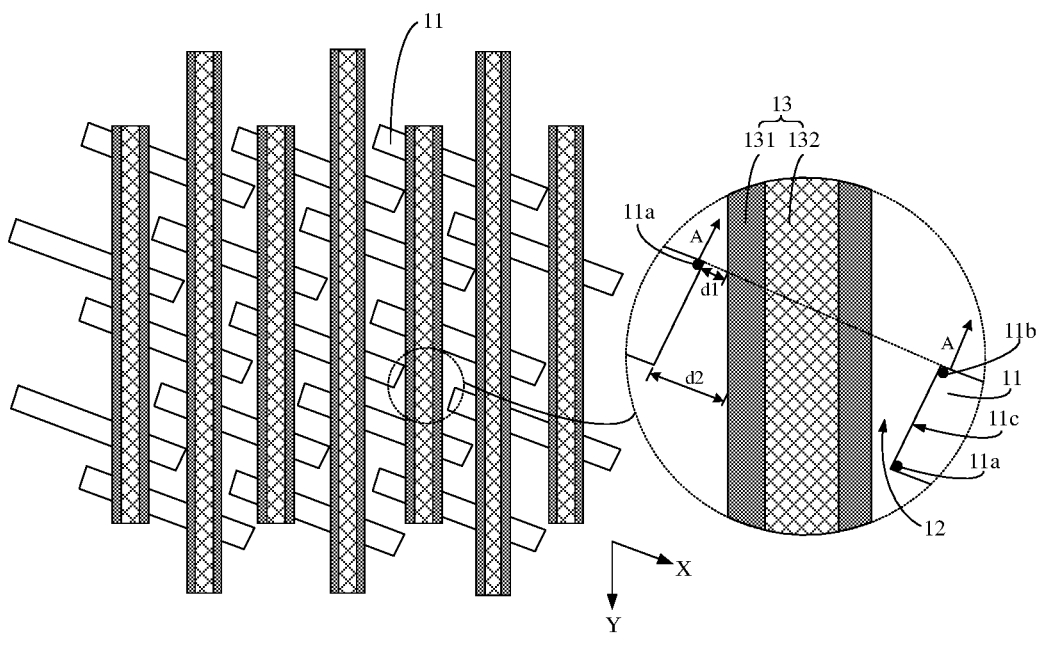
FIG. 1 is a top view of a memory according to an embodiment of the present disclosure.
Figure 2:
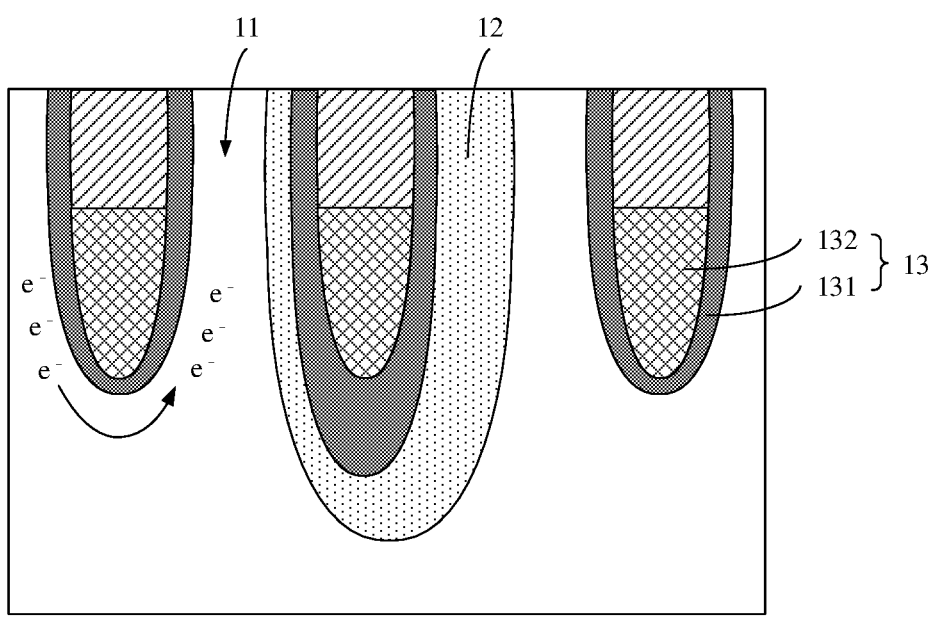
FIG. 2 is a schematic sectional structure diagram in a sectional direction AA in FIG. 1.

Referring to FIGS. 1 and 2, FIG. 1 is a top view of the memory, and FIG. 2 is a schematic sectional structure diagram in a sectional direction AA in FIG. 1.

The memory comprises: active regions 11 extending in a first direction X, isolation structures 12 located between adjacent active regions 11, and word lines 13 extending in a second direction Y and partially located in the isolation structures 12. In a direction parallel to the first direction X, each active region 11 has an end face 11c facing the word line 13.

Since the first direction X and the second direction Y are generally not perpendicular to each other, when the word line 13 between adjacent active regions 11 is straight line, in a direction parallel to the first direction X, there are different distances between different positions on the end face 11c and the word line, that is, the extreme difference in distances between the end face 11c and the word line 13 is not zero.

In a direction parallel to the first direction X, the end face 11c has first position 11a closest to the word line 13 and second position 11b farthest from the word line 13, there is a first distance d1 between the first position 11a and the word line 13, there is a second distance d2 between the second position 11b and the word line 13, and the difference between the first distance d1 and the second distance d2 is an extreme difference. When the first direction X is not perpendicular to the second direction Y, the extreme difference is not zero, and the size of the extreme difference increases with the decrease of the included angle between the first direction X and the second direction Y.

Since the active regions 11 on two sides of the word line 13 are usually distributed symmetrically and the distance between adjacent active regions 11 is fixed, the larger the extreme difference in distances between the end face 11c and the word line 13 is, the smaller the first distance d1 is, and the larger the second distance d2 is. In a case where the thickness of a gate dielectric layer 131 remains unchanged, since the gate conductive layer 132 in the isolation structures 12 is closer to the first position 11a of the active region 11, the electric field applied to the first position 11a by the gate conductive layer 132 in the isolation structures 12 is stronger, and the electrons at drain region (e.g., region between two adjacent word lines 13 in the active regions 11) in the active region 11 are easier to be actuated. When a large number of electrons are actuated to gather below the word line 13 in the active region 11, channel will be formed below the word line 13. In this case, electrons will migrate from the drain region in the active region 11 to the source region (i.e., region close to the gate conductive layer 132 in the isolation structures 12) in the active region 11, resulting in signal interference.

It is to be noted that, since the first position 11a is closer to the word line 13 in the isolation structures 12, electron crosstalk usually occurs between the first position 11a of the active region 11 and the isolation structures 12.

It can be known from the above analysis that, when the extreme difference in distances between the end face 11c and the gate conductive layer 132 is greater than the preset range, the gate conductive layer 132 in the isolation structures 12 is closer to the first position 11a, and the gate conductive layer 132 in the isolation structures 12 is easier to actuate electrons in the active region 11, so that the electrons in the active region 11 gather in the active region 11 below the word line close to the isolation structures 12 and form channel, resulting in signal interference.

An embodiment of the present disclosure provides a memory. In this memory, the extreme difference in distances between the end face and the gate conductive layer is within the preset range, and there is a large distance between the position on the end face closer to the gate conductive layer and the gate conductive layer, so that the electric field applied to the position by the gate conductive layer is small. Thus, it is advantageous to decrease the number of electrons that can be actuated by the gate conductive layer, the formation of channel is restrained, and the signal interference is reduced.

Referring to FIGS. 3-9, FIGS. 3-9 are schematic structure diagrams of steps in a method for manufacturing a memory according to a first embodiment of the present disclosure. For clarity of illustration, at each step, the top view of the memory and the schematic sectional structure diagram of the memory in a sectional direction AA are shown.

Figure 3:
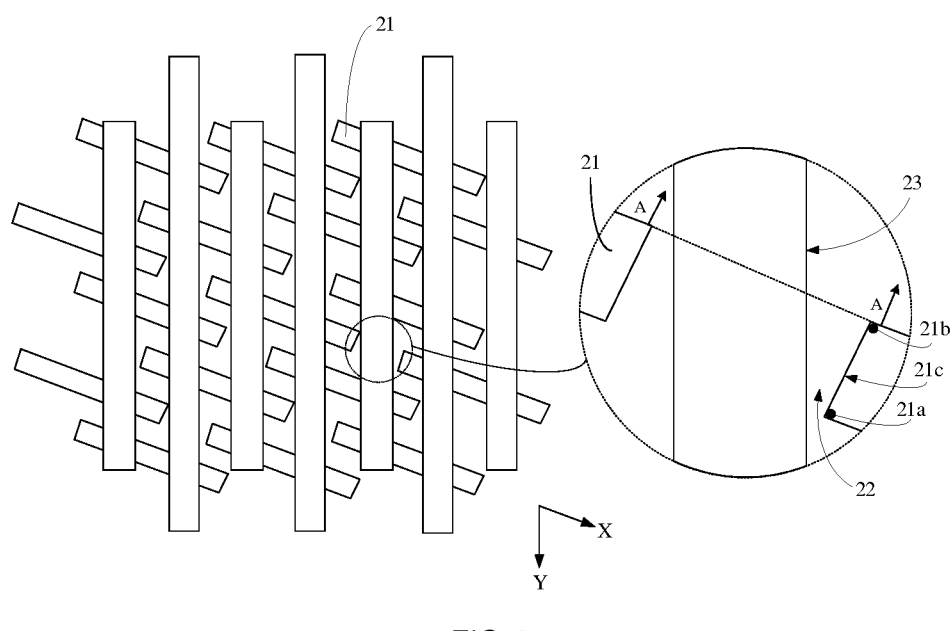
FIG. 3 is a top view of active regions extending in a first direction and word lines extending in a second direction in the memory according to a first embodiment of the present disclosure.
Figure 4:
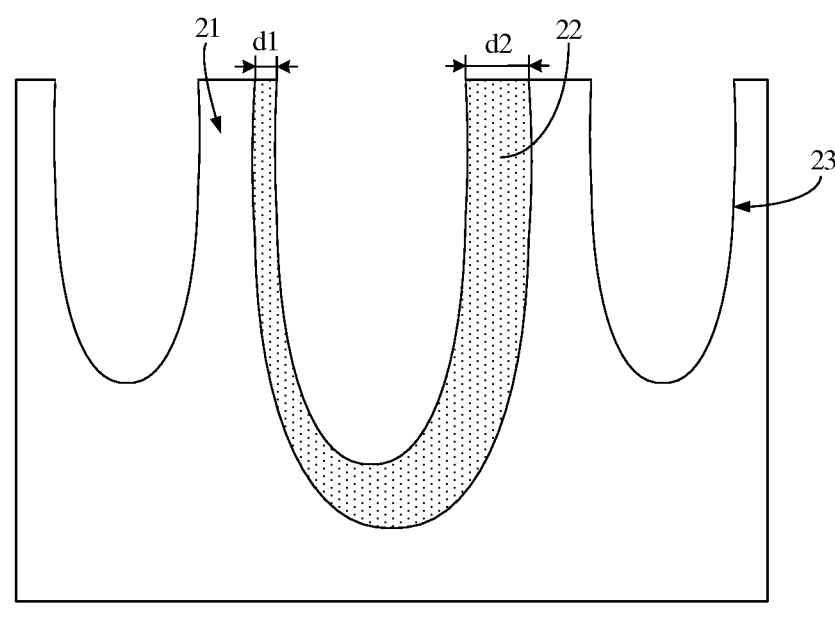
FIG. 4 is a schematic sectional structure diagram of the memory in a sectional direction AA in FIG. 3.

Referring to FIGS. 3 and 4, active regions 21 extending in a first direction X and recesses 23 extending in a second direction Y are provided.

In this embodiment, isolation structures 22 are provided between adjacent active regions 21, the recess 23 is located in the active regions 21 and the isolation structures 22, and the recess 23 is configured to allow word line to be filled therein. In other embodiments, there may also be other structure or empty recess between adjacent active regions. When there is empty recess between adjacent active regions, a gate dielectric layer in a specific shape may be formed subsequently by deposition or other processes.

In this embodiment, in a direction parallel to the first direction X, the active region 21 has end face 21c facing the recess 23, and the material for the active region 21 comprises monocrystalline silicon. In other embodiments, the material for the active region may also be semiconductor materials such as polycrystalline silicon and germanium.

In this embodiment, the recess 23 located between adjacent active regions 21 is straight groove; the first direction X is not perpendicular to the second direction Y; and, in a direction parallel to the first direction X, the end face 21c has first position 21a closest to the recess 23 and second position 21b farthest from the recess 23, there is a first distance d1 between the first position 21a and the recess 23, there is a second distance d2 between the second position 21b and the recess 23, and the first distance d1 is less than the second distance d2. It can be known from the sectional view in the sectional direction AA that the recess 23 located in the isolation structures 22 is closer to one active region 21 and farther from another active region 21.

In this embodiment, the difference between the first distance d1 and the second distance d2 is greater than a preset range, that is, the extreme difference in distances between the end face 21c and the word line is greater than the preset range. In order to allow the extreme difference in distances between the end face 21c and the subsequently formed gate conductive layer to be within the preset range, it is necessary to form gate dielectric layer with difference thicknesses to adjust the distances between the end face 21c and the gate conductive layer, so that the electric field isolation ability of dielectric layer between the end face 21c and the gate conductive layer is adjusted. The dielectric layer comprises isolation structures 22 and gate dielectric layer between the end face 21c and the gate conductive layer.

Figure 5:
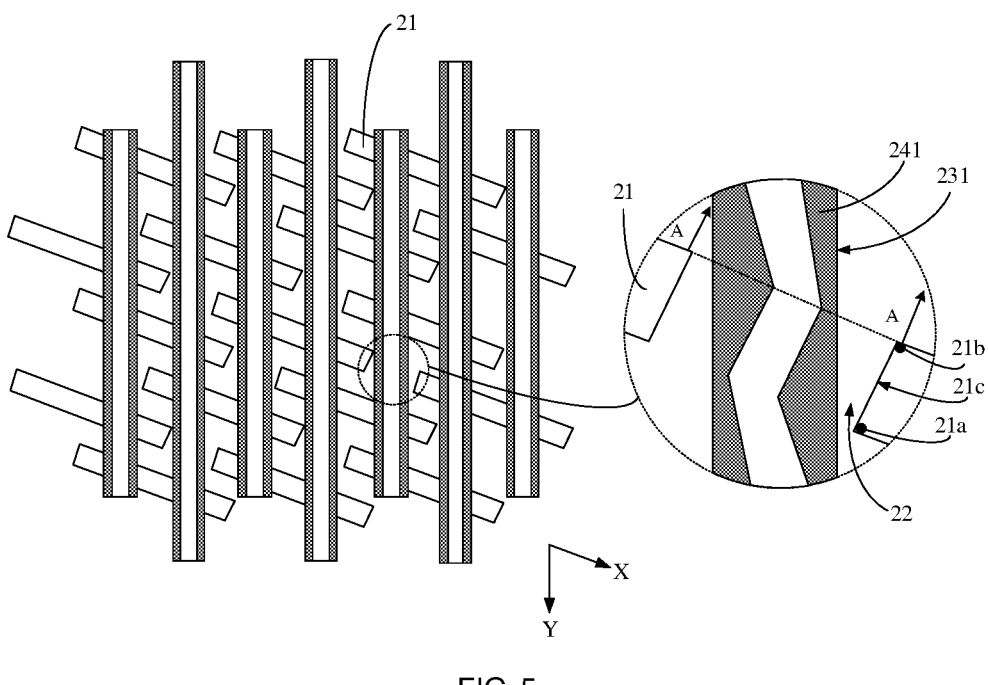
FIG. 5 is a top view after gate dielectric layers are formed in the word lines of the memory in FIG. 3.
Figure 6:
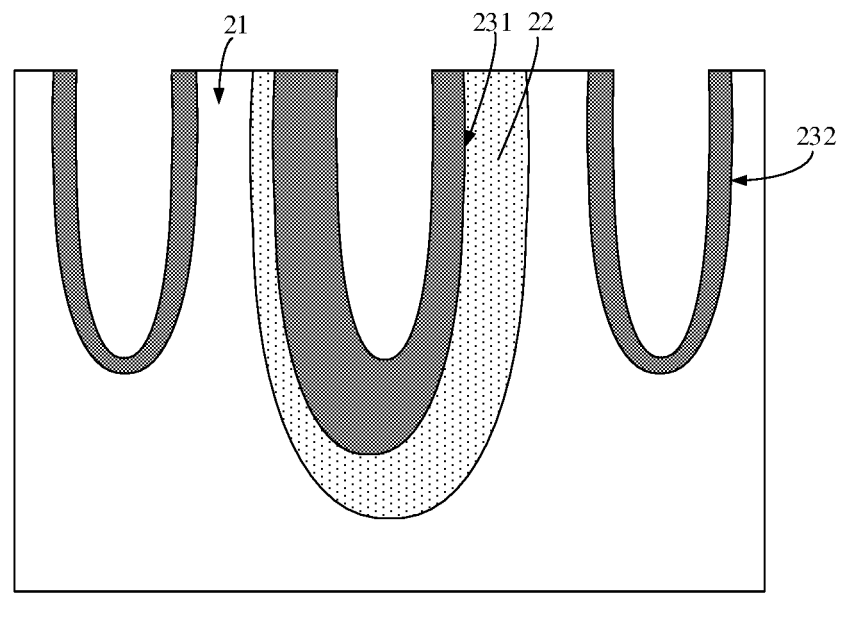
FIG. 6 is a schematic sectional structure diagram of the memory in a sectional direction AA in FIG. 5.

Referring to FIGS. 5 and 6, an in-situ growth process is performed to use the material in the active regions to form a gate dielectric layer 241.

For simplicity of expression, the recess 23 located in the isolation structures 22 is defined as first recess 231, and the recess 23 located in the active regions 21 is defined as second recess 232.

In this embodiment, since the gate dielectric layer 241 need to be formed from the material in the active regions 21, in the process of forming the gate dielectric layer 241, the time required to diffuse the material in the active regions 21 to the surfaces of the first recesses 231 will determine the formation rate of the gate dielectric layer 241 and the thickness of the gate dielectric layer 241. For example, in the case of the same atom diffusion rate, since the first position 21a is closer to the first recess 231, the material at the first position 21a can diffuse to the surface of the first recess 231 faster to form the gate dielectric layer 241, so that the thickness of the gate dielectric layer 241 on the surface of the first recess 231 corresponding to the first position 21a is greater than that of the gate dielectric layer 241 on the surface of the first recess 231 corresponding to the second position 21*b*.

The principle description will be given below by taking the formation of the gate dielectric layer 241 made of silicon oxide by an oxidation process as an example.

During the oxidation process, since the first position 21*a* is closer to the first recess 231, more silicon atoms can diffuse from the first position 21*a* to the surface of the first recess 231 in unit time, so that the gate dielectric layer 241 with a larger thickness is formed on the surface of the first recess 231. Correspondingly, since the second position 21*b* is farther from the first recess 231, only few silicon atoms can diffuse from the second position 21*b* to the surface of the first recess 231 in unit time, so that the gate dielectric layer 241 on the surface of the first recess 231 corresponding to the second position 21*b* is thinner.

Correspondingly, since the second recess 232 is directly located in the active regions 21, the influence of the atom diffusion time on the thickness of the gate dielectric layer 241 is not taken into consideration in the process of forming the gate dielectric layer 241, and the gate dielectric layer 241 covering the sidewalls of the second recess 232 is relatively uniform.

By using the positional relationship of the first position 21*a* and the second position 21*b* relative to the first recess 231, the gate dielectric layer 241 with different thicknesses is formed by the in-situ growth process, so it is advantageous to reduce the extreme difference in distances between the end face 21*c* and the subsequently formed gate conductive layer. Thus, the extreme difference in distances between the end face 21*c* and the gate conductive layer is within the preset range even if there is a large distance between the position on the end face 21*c* close to the gate conductive layer and the gate conductive layer, and the electric field applied to the position by the gate conductive layer is small. Accordingly, the number of electrons that can be actuated by the gate conductive layer is decreased, the formation of channel is restrained, and the signal interference is reduced. In this embodiment, only the formation of silicon oxide as the gate dielectric layer 241 by the oxidation process is taken as an example. In other embodiments, it is also possible to form silicon nitride or germanium nitride as the gate dielectric layer by a nitridation process. The material for the gate dielectric layer is related to the material for the active regions.

In this embodiment, in a direction parallel to the first direction X, the thickness of the gate dielectric layer 241 on the surface of the first recess 231 corresponding to the first position 21*a* is largest and has a maximum value of 3 nm to 5 nm, for example, 3.5 nm, 4 nm or 4.5 nm; and, the thickness of the gate dielectric layer 241 on the surface of the first recess 231 corresponding to the second position 21*b* is smallest and has a minimum value of 1 nm to 3 nm, for example, 1.5 nm, 2 nm or 2.5 nm.

In this embodiment, the preset range for the extreme difference in distances between the end face 21*c* and the gate conductive layer is 0 nm to 0.4 nm, for example, 0.1 nm, 0.2 nm or 0.3 nm. If the preset range is too large, the distance between the subsequently formed gate conductive layer and the first position 21*a* may be too small, resulting in signal interference.

In this embodiment, the gate dielectric layer 241 is formed by a thermal oxidation process. Since the thermal oxidation process has a high process temperature and the high temperature environment is advantageous to accelerate the diffusion motion of atoms, the formation of the gate dielectric layer 241 by the thermal oxidation process is advantageous to shorten the process time. The temperature for the thermal oxidation process is 900° C. to 1100° C., for example, 950° C., 1000° C. or 1500° C.

It is to be noted that, with the formation of the gate dielectric layer 241, the time required to diffuse silicon atoms in the active regions 21 to the surface of the current gate dielectric layer 241 will increase gradually, and the thickness of the gate dielectric layer 241 grown in unit time will become smaller and smaller.

In other words, with the progress of the oxidation process, the formation rate of the gate dielectric layer 241 on the surface of the first recess 231 corresponding to the first position 21*a* will tend to be equal to that of the gate dielectric layer 241 on the surface of the first recess 231 corresponding to the second position 21*b*. In this case, in a direction parallel to the first direction X, the difference between the thickness of the dielectric layer between the first position 21*a* and the gate conductive layer and the thickness of the dielectric layer between the second position 21*b* and the gate conductive layer is also small, and the difference in the electric field isolation ability between the dielectric layer corresponding to different positions is small.

In this embodiment, the thermal oxidation process lasts for 10 min to 60 min, for example, 20 min, 40 min or 50 min. If the process time is too short, it is disadvantageous to allow the extreme difference in distances between the end face 21*c* and the gate conductive layer to be within the preset range; however, if the process time is too long, too thick gate dielectric layer 241 will be formed, so that the space reserved for the gate conductive layer is too small, the resistance of the gate conductive layer is large, the threshold voltage for the word line in the active regions 21 is too high, the required operating voltage is increased, and the sensitivity of the memory is reduced.

In other embodiments, the oxidation process further comprises an in-situ steam generation process, a wet oxidation process and a dry oxidation process.

In this embodiment, the permittivity of the material for the gate dielectric layer 241 is greater than or equal to that of the material for the isolation structures 22. Thus, the difference in thickness of the isolation structures 22 corresponding to different positions on the end face 21*c* can be compensated by thinner gate dielectric layer 241, a larger space is reserved for the gate conductive layer, and the resistance of the gate conductive layer is reduced.

In this embodiment, after the in-situ growth process, the gate dielectric layer 241 on a side of the isolation structures 22 with a small thickness are thicker, while the gate dielectric layer 241 on a side of the isolation structures 22 with a large thickness are thinner, so that the extreme difference in distances between the end face 21*c* and the gate conductive layer is within the preset range, and the channel reserved for the gate conductive layer can be regarded as being located in the centers of adjacent active regions 21.

Figures 7, 8:
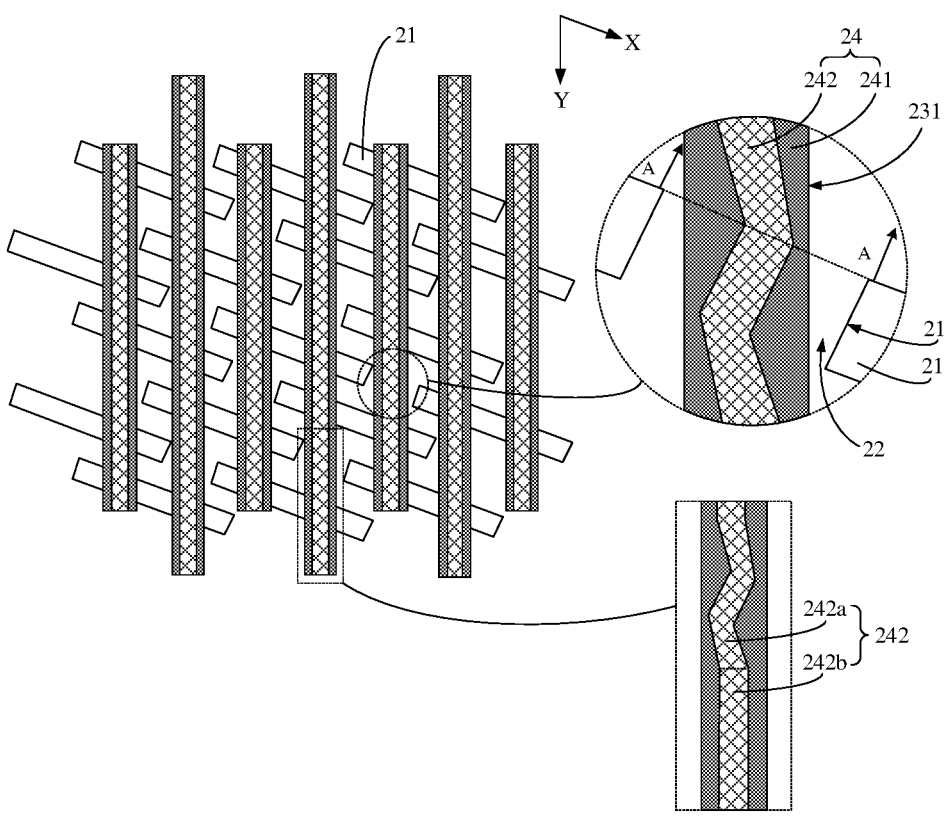
FIG. 7 is a top view after gate conductive layers are formed in the active regions of the memory in FIG. 5.
FIG. 8 is a schematic sectional structure diagram of the memory in a sectional direction AA in FIG. 7.
Figure 9:
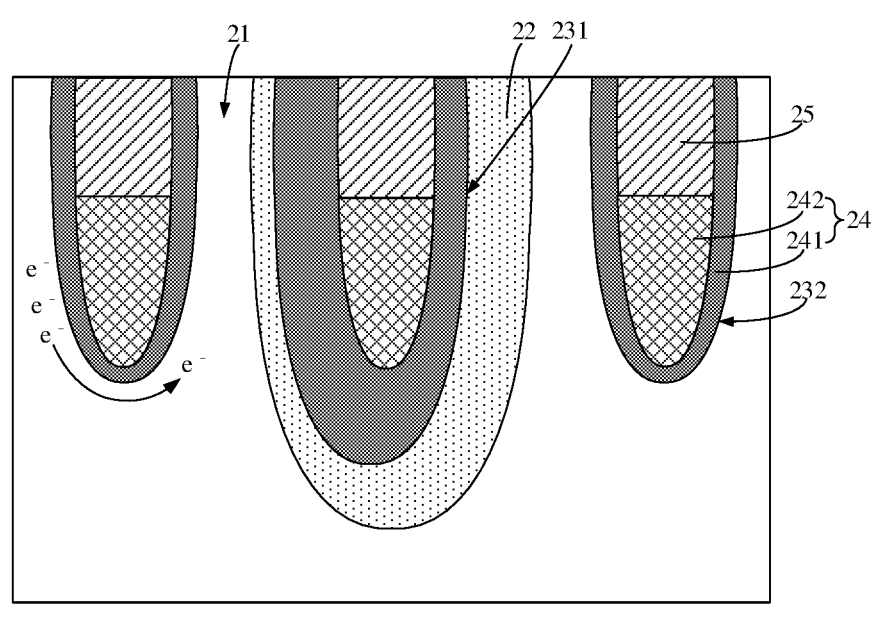
FIG. 9 is a schematic sectional structure diagram in a sectional direction AA after dielectric layers are formed in the word lines of the memory in FIG. 7.

Referring to FIGS. 7 and 8, the gate conductive layer 242 is filled in the first recess 231 and the second recess 232, and the gate dielectric layer 241 and the gate conductive layer 242 form word line 24. The gate conductive layer 242 has a width of 5 nm to 15 nm, and the material for the gate conductive layer 242 comprises tungsten. Referring to FIG. 9, dielectric layer 25 used for electrical isolation or supporting is formed on the word lines 24. In addition, block layer (not shown) may also be formed between the gate dielectric layer 241 and the gate conductive layer 242, and the material for the block layer comprises titanium nitride.

In this embodiment, since the gate dielectric layer 241 at different positions in the first recess 231 are different in thickness and the gate dielectric layer 241 at different positions in the second recess 232 is the same in thickness, the gate conductive layer 242 filled in the first recess 231 and the second recess 232 will be in different shapes. The gate conductive layer 242 comprises bent portions 242a located between adjacent active regions 21 and straight portions 242b located in the active regions 21. The straight portions 242b extend in the second direction Y, and the bent portions 242a have parts extending in a direction perpendicular to the first direction X.

In this embodiment, the extreme difference in distances between the end face and the gate conductive layer is within the preset range, and there is a large distance between the position on the end face closest to the gate conductive layer and the gate conductive layer. Thus, it is advantageous to avoid a too large electric field applied to certain position on the end face by the gate conductive layer, so that the electrons at the position are prevented from being actuated to migrate, and the signal interference between adjacent word lines is reduced.

Another embodiment of the present disclosure further provides a method for manufacturing a memory. Unlike the previous embodiment, in this embodiment, the extreme difference in distances between the end face and the first recess is within the preset range. The detailed description will be given with reference to FIGS. 10-15. FIGS. 10-15 are schematic structure diagrams corresponding to steps in the method for manufacturing a memory according to a second embodiment of the present disclosure. For the formation steps that are the same as or corresponding to the previous embodiment, reference can be made to the corresponding description of the previous method embodiment, and they will not be repeated below.

Figure 10:
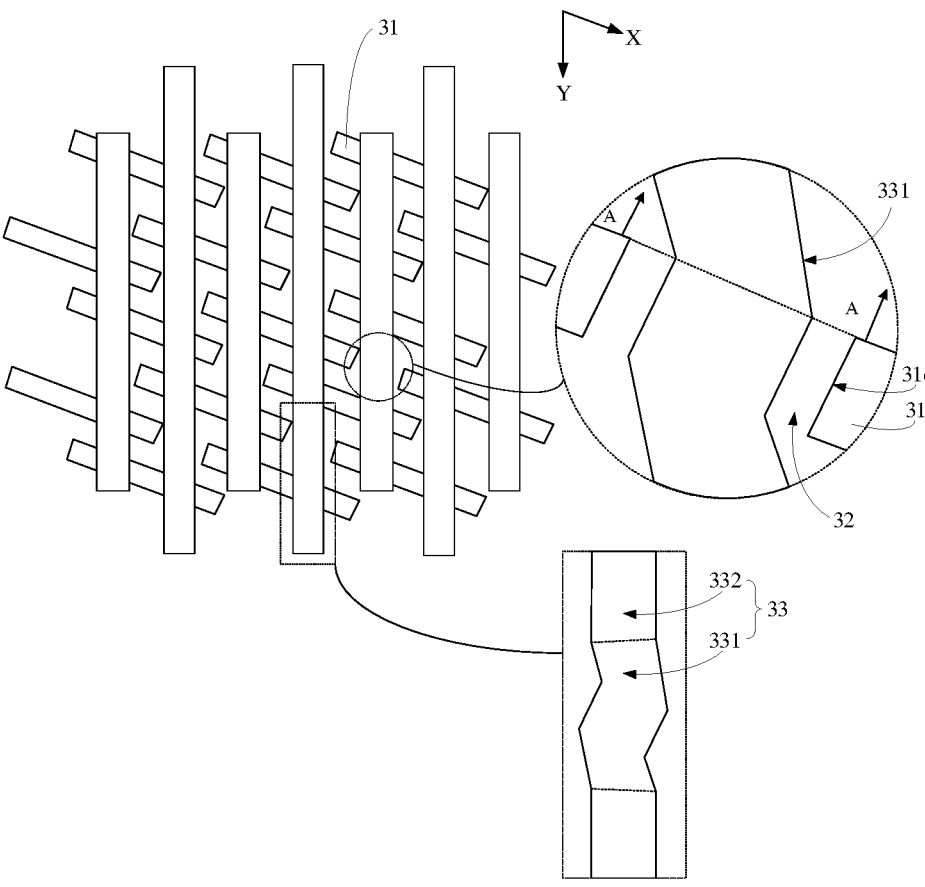
FIG. 10 is a top view of active regions extending in a first direction and word lines extending in a second direction in the memory according to a second embodiment of the present disclosure.
Figure 11:
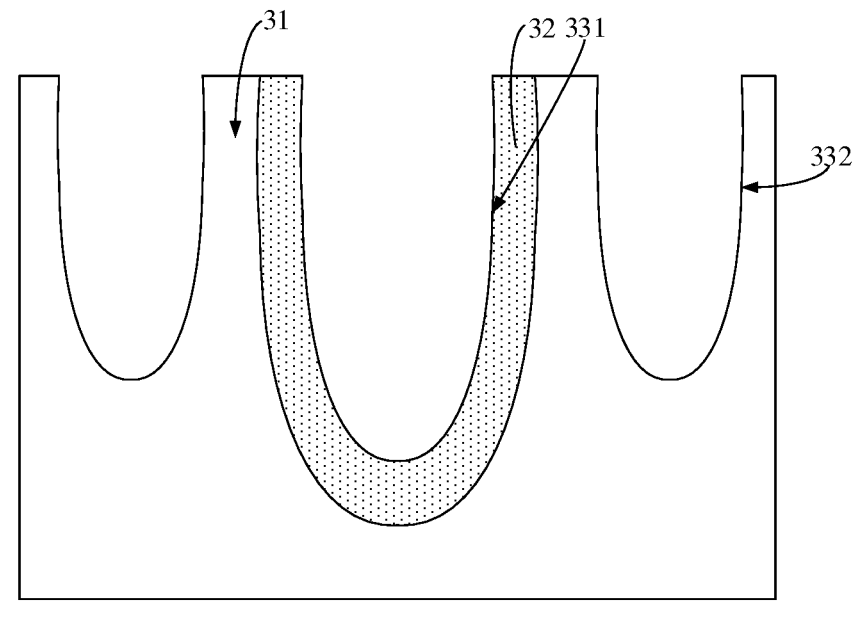
FIG. 11 is a schematic sectional structure diagram of the memory in a sectional direction AA in FIG. 10.

Referring to FIGS. 10 and 11, active regions 31 extending in a first direction X and recesses 33 extending in a second direction Y are provided.

In this embodiment, the recesses 33 comprise first recess 331 located between adjacent active regions 31 and second recess located in the active regions 31. In a direction parallel to the first direction X, the extreme difference between the end face 31c and the first recess 331 is within the preset range.

In this embodiment, the recesses 33 may be formed by etching the isolation structures 32 by an etching process. Since the shape of the first recess 231 needs to be adjusted according to the position of the end face 31c, it can be known from the top view that the first recess 331 is in a bent state, and the second recess 332 is in a straight state. The recesses 33 in a special shape are formed through a special mask by etching, so that it is advantageous to improve the structural stability of the recesses 33 and further improve the structural stability of the word lines.

Figure 12:
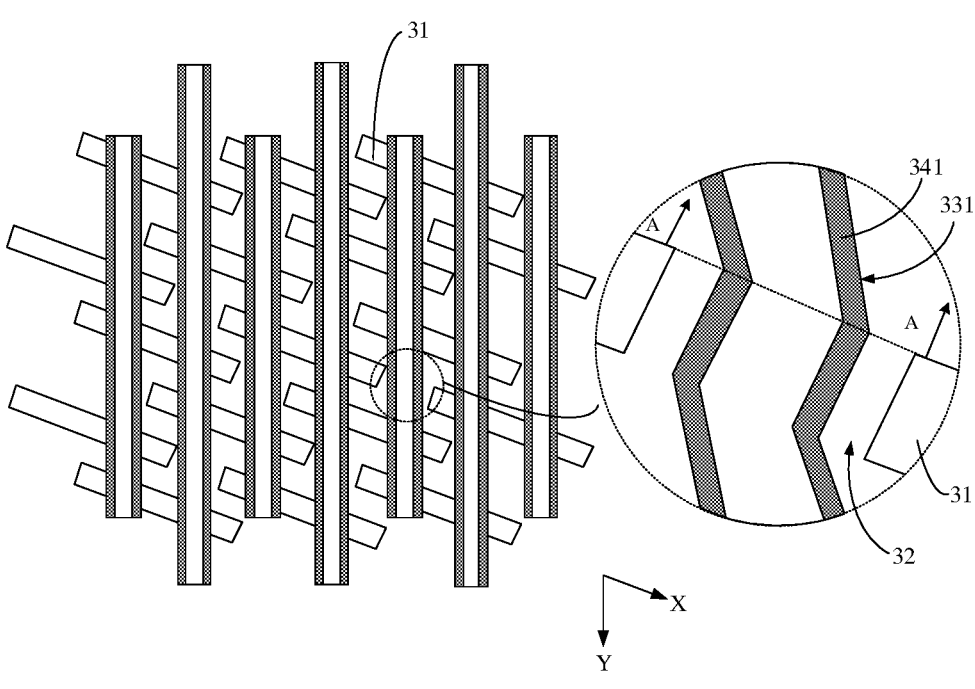
FIG. 12 is a top view after gate dielectric layers are formed in the word lines of the memory in FIG. 10.
Figure 13:
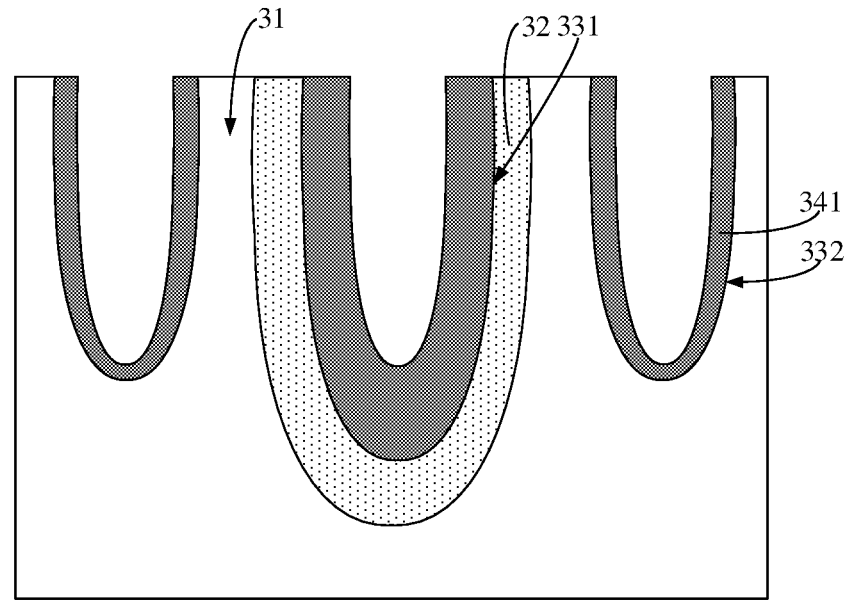
FIG. 13 is a schematic sectional structure diagram of the memory in a sectional direction AA in FIG. 12.

Referring to FIGS. 12 and 13, gate dielectric layer 341 are formed.

In this embodiment, the gate dielectric layer 341 may be formed by an in-situ growth process or deposition process. When the in-situ growth process is used, since the extreme difference in distances between the end face 31c and the first recess 331 is within the preset range, the difference in thickness of the gate dielectric layer 341 at difference positions is also small.

Figure 14:
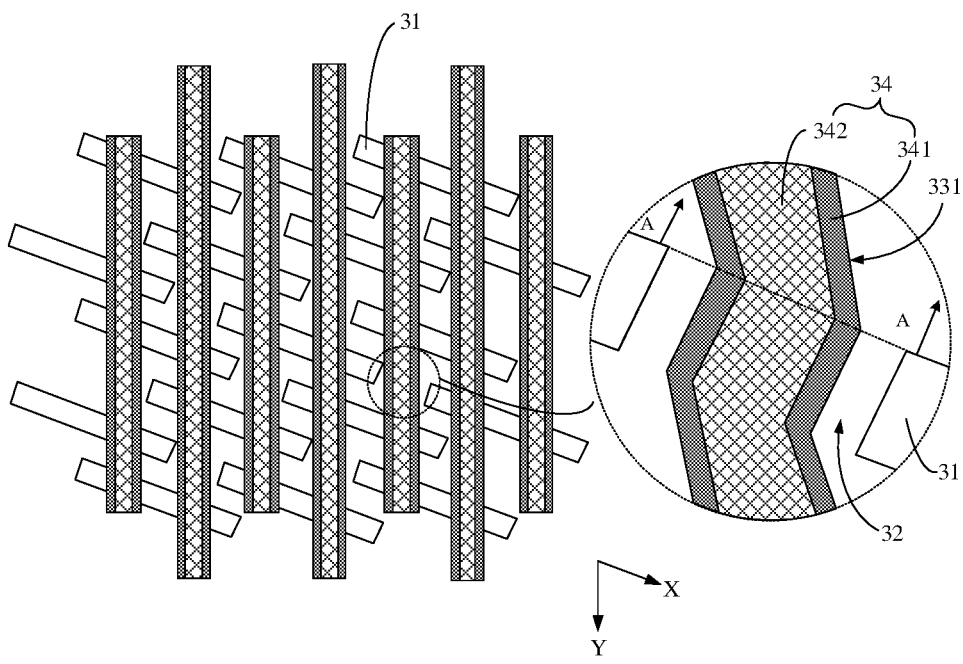
FIG. 14 is a top view after gate conductive layers are formed in the word lines of the memory in FIG. 12.
Figure 15:
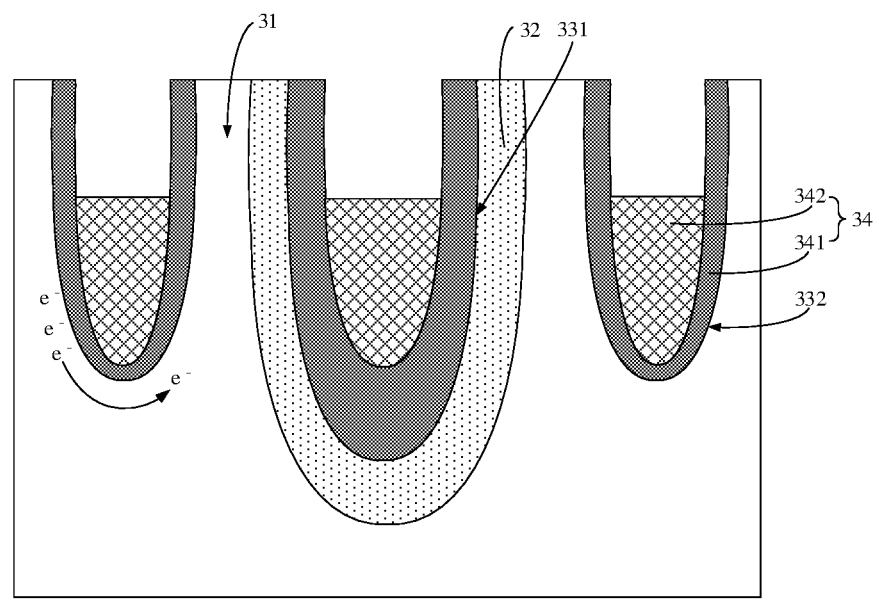
FIG. 15 is a schematic sectional structure diagram of the memory in a sectional direction AA in FIG. 14.
Figure 16:
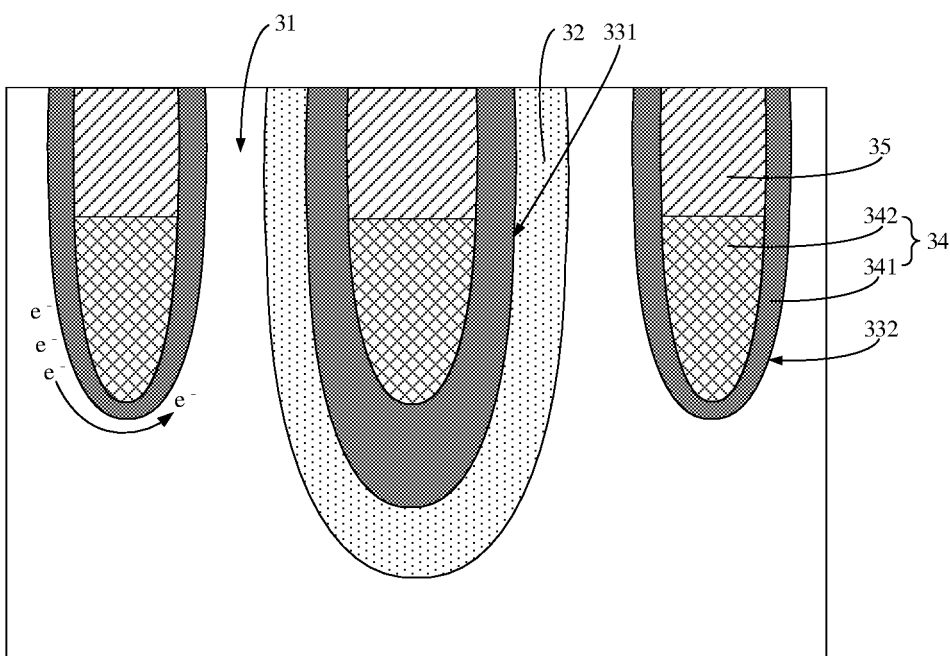
FIG. 16 is a schematic sectional structure diagram in a sectional direction AA after dielectric layers are formed in the word lines of the memory in FIG. 14.

Referring to FIGS. 14 and 15, gate conductive layer 342 is filled in the first recess 331 and the second recess 332, and the gate dielectric layer 341 and the gate conductive layer 342 form word line 34. The gate conductive layer 342 have a width of 5 nm to 15 nm, and the material for the gate conductive layer 342 comprises tungsten. Referring to FIG. 16, dielectric layer 35 is formed on the word lines 34. The dielectric layer 35 has electrical isolation and supporting effects. In addition, block layer (not shown) may also be formed between the gate dielectric layer 341 and the gate conductive layer 342, and the material for the block layer comprises titanium nitride.

In this embodiment, the recesses in a special shape are formed directly by a special mask. Thus, it is advantageous to ensure that the recesses at different positions and the word lines formed by filling the recesses have good structural stability, and the memory has good performance stability.

An embodiment of the present disclosure further provides a memory, which may be manufactured by the above method for manufacturing a memory.

Referring to FIGS. 7 and 8, the memory comprises: active regions 21 extending in a first direction X and word lines 24 extending in a second direction Y, wherein each word line 24 is partially located between adjacent active regions 21; the word line 24 comprises a gate conductive layer 242; and, in a direction parallel to the first direction X, each active region 21 has end face 21c facing the word line 24, and the extreme difference in distances between the end face 21c and the gate conductive layer 242 is within a preset range.

In this embodiment, in a direction parallel to the first direction X, the extreme difference in distances between the end face 21c and the word line 24 is greater than the preset range. In other embodiments, referring to FIG. 10, in a direction parallel to the first direction, the extreme difference in distances between the end face 31c and the first recess 331 is within the preset range.

In this embodiment, the word line 24 further comprises a gate dielectric layer 241 located between the gate conductive layer 242 and the active regions 21. In a direction parallel to the first direction X, the thickness of the gate dielectric layer 241 has a maximum value of 3 nm to 5 nm (e.g., 3.5 nm, 4 nm or 4.5 nm) and a minimum value of 1 nm to 3 nm (e.g., 1.5 nm, 2 nm or 2.5 nm).

In this embodiment, the preset range is 0 nm to 0.4 nm.

In this embodiment, the memory further comprises: isolation structures 22 located between adjacent active regions 21. The word line 24 is located in the isolation structures 22, and the word line 24 comprises a gate dielectric layer 241 located between the isolation structures 22 and the gate conductive layer 242. The permittivity of the material for the gate dielectric layer 241 is greater than or equal to that of the material for the isolation structures 22.

In this embodiment, the gate conductive layer 242 comprises bent portions 242a and straight portions 242b which adjoin to one another. The straight portions 242b are located in the active regions 21, and the bent portions 242a are located between adjacent active regions 21.

In this embodiment, the extreme difference in distances between the end face and the gate conductive layer is within the preset range, and there is a large distance between the position on the end face closest to the gate conductive layer and the gate conductive layer. Thus, it is advantageous to avoid a too large electric field applied to certain position on the end face by the gate conductive layer, so that the electrons at the position are prevented from being actuated to migrate, and the signal interference between adjacent word lines is reduced.

Those skilled in the art will readily think of other embodiments of the present disclosure by considering the disclosure of the specification and practicing. The present disclosure is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the following claims.

It should be understood that the present disclosure is not limited to the precise structures that have been described above and shown in the drawings, and various modifications and changes may be made without departing from its scope. The scope of the present disclosure is defined only by the appended claims.

INDUSTRIAL APPLICABILITY

For the memory and manufacturing method thereof according to the present disclosure, the extreme difference in distances between the end face and the gate conductive layer is within the preset range, and there is a large distance between the position on the end face closest to the gate conductive layer and the gate conductive layer. Thus, it is advantageous to avoid a too large electric field applied to certain position on the end face by the gate conductive layer, so that the electrons at the position are prevented from being actuated to migrate, and the signal interference between adjacent word lines is reduced. In addition, in a direction parallel to the first direction, when the permittivity at different positions on the end face is different from that of the gate conductive layer, a gate dielectric layer material having a larger or equal permittivity is used for difference compensation, so that it is advantageous to reduce the thickness of the gate dielectric layer and reserve a larger space for the gate conductive layer, the resistance of the gate conductive layer is reduced, and the signal transmission performance of the word lines is improved.

The invention claimed is:

1. A memory, comprising:
a plurality of active regions extending along a first direction and an isolation structure between the active regions; and
a plurality of word lines extending along a second direction, wherein the first direction is not perpendicular to the second direction and intersects with the second direction;
wherein each of the word lines comprises a gate conductive layer and a gate dielectric layer, the gate dielectric layer is extending from the active regions to the isolation structure with a straight boundary along the second direction, the boundary is located on a side opposite the gate conductive layer; and
the gate conductive layer of a given one of the word lines comprises a bent portion located in the isolation structure, a thickness of the gate dielectric layer at the bent portion is non-uniform, the thickness of the gate dielectric layer at the bent portion is complementary to the bent portion for forming the straight boundary.

2. The memory according to claim 1, wherein, in the first direction, a difference between a farthest distance and a nearest distance from an end face of the active region to the gate conductive layer, is less than a difference between a farthest distance and a nearest distance from the end face of the active region to the given one of the word lines.

3. The memory according to claim 1, wherein between end faces of the adjacent active regions, a thickness of the gate dielectric layer near a thinner side of the isolation structure, is greater than a thickness of the gate dielectric layer near a thicker side of the isolation structure.

4. The memory according to claim 3, wherein, between the end faces of the adjacent active regions, the thickness of the gate dielectric layer near the thinner side of the isolation structure ranges from 3 nm to 5 nm, and the thickness of the gate dielectric layer near the thicker side of the isolation structure ranges from 1 nm to 3 nm.

5. The memory according to claim 1, wherein the gate dielectric layer is formed by a thermal oxidation process.

6. The memory according to claim 1, wherein a difference between a farthest distance and a nearest distance between an end face of the active region and the gate conductive layer is less than a preset value of 0.4 nm.

7. The memory according to claim 1, wherein the gate conductive layer of a given one of the word lines comprises a straight portion located in an active region of the active regions, the straight portion extends in the second direction and the bent portion comprises a part extending in a third direction perpendicular to the first direction at the area.

8. The memory according to claim 1, wherein the given one of the word lines is formed in a recess, the recess comprises a first recess and a second recess, the first recess is formed in the isolation structure, the second recess is formed in the active region, the first recess is connected with the second recess, and the recess extends in the second direction, and the recess is straight, the bent portion is formed in the first recess.

9. The memory according to claim 8, wherein a thickness of the gate dielectric layer in the first recess increases as an end face of the active region is positioned closer to the first recess, while the thickness of the gate dielectric layer in the first recess decreases as the end face is positioned farther away from the first recess.

10. A method for manufacturing a memory, comprising:
providing a plurality of active regions extending along a first direction and a recess extending along a second direction, an isolation structure being arranged between the active regions, wherein the first direction is not perpendicular to the second direction and intersects with the second direction; and
forming a word line in the recess, wherein the word line comprises a gate dielectric layer and a gate conductive layer, the gate dielectric layer is extending from the active regions to the isolation structure with a straight boundary along the second direction, the boundary is located on a side opposite the gate conductive layer; and
the gate conductive layer of the word line comprises a bent portion located in the isolation structure, a thickness of the gate dielectric layer at the bent portion is non-uniform, the thickness of the gate dielectric layer at the bent portion is complementary to the bent portion for forming the straight boundary.

11. The method for manufacturing the memory according to claim 10, comprising forming the gate dielectric layer on an inner wall of the recess by a thermal oxidation process.

12. The method for manufacturing the memory according to claim 11, wherein a temperature range of the thermal oxidation process is 900° C. to 1100° C.

13. The method for manufacturing the memory according to claim 10, comprising forming the gate dielectric layer by an in-situ growth process or a deposition process.

14. The method for manufacturing the memory according to claim 13, wherein the in-situ growth process comprises an oxidation process or a nitridation process.

15. The method for manufacturing the memory according to claim 10, wherein a difference between a farthest distance and a nearest distance between an end face of the active region and the gate conductive layer is less than a preset value of 0.4 nm.

16. The method for manufacturing the memory according to claim 10, wherein, in the first direction, a difference between a farthest distance and a nearest distance from an end face of the active region to the gate conductive layer is less than or equal to a difference between a farthest distance and a nearest distance from the end face of the active region to the word line.

17. The method for manufacturing the memory according to claim 10, wherein the gate conductive layer of the word line comprises a straight portion located in an active region of the active regions, the straight portion extends in the second direction and the bent portion comprises a part extending in a third direction perpendicular to the first direction at the area.

18. The method for manufacturing the memory according to claim 10, wherein the recess comprises a first recess and a second recess, the first recess is formed in the isolation structure, the second recess is formed in the active region, the first recess is connected with the second recess, and the first recess extends in the second direction, and the second recess extends in the second direction.

19. The method for manufacturing the memory according to claim 18, wherein a thickness of the gate dielectric layer in the first recess increases as an end face of the active region is positioned closer to the first recess, while the thickness of the gate dielectric layer in the first recess decreases as the end face is positioned farther away from the first recess.

\* \* \* \* \*